(12) United States Patent
Dananay et al.

(10) Patent No.: US 7,880,488 B2
(45) Date of Patent: Feb. 1, 2011

(54) UNIVERSAL CURRENT LEAKAGE TESTING ADAPTER

(75) Inventors: Steven Emil Dananay, Longmont, CO (US); G. Wayne Moore, Lyons, CO (US); James Ginther, Boulder, CO (US)

(73) Assignee: Unisyn Medical Technologies, Inc., Longmont, CO (US)

( * ) Notice: Subject to any disclaimer, the term of this patent is extended or adjusted under 35 U.S.C. 154(b) by 156 days.

(21) Appl. No.: 12/262,500

(22) Filed: Oct. 31, 2008

(65) Prior Publication Data

US 2010/0109694 A1    May 6, 2010

(51) Int. Cl.
*G01R 31/00* (2006.01)
(52) U.S. Cl. .............................. 324/756.05; 324/754.08
(58) Field of Classification Search ........................ None
See application file for complete search history.

(56) References Cited

U.S. PATENT DOCUMENTS 5,269,693 A * 12/1993 Sekine .......................... 439/74
5,685,734 A * 11/1997 Kutz ............................ 439/409

\* cited by examiner

*Primary Examiner*—Minh N Tang
(74) *Attorney, Agent, or Firm*—March Fischmann & Breyfogle LLP

(57) ABSTRACT

In one embodiment, a universal current leakage measurement device is disclosed. A universal current leakage testing adapter has the ability to couple with at least two differently sized or shaped probe connectors. The universal current leakage testing adapter is configured to couple with differently sized or shaped probe connectors by conductive planes either functioning independently or in concert to contact the pins of a probe connector.

20 Claims, 8 Drawing Sheets

UNIVERSAL CURRENT LEAKAGE TESTING ADAPTER

BACKGROUND

This disclosure relates in general to connector adapters and, but not by way of limitation, to universal adapters for testing current leakage from probe connectors, such as ultrasound probe connectors, among other things.

Most original equipment manufacturers of ultrasound probes supply leakage testers with the probes. Probe connectors typically differ in size and style and therefore may require a different supply leakage tester and procedure.

While at least one other manufacturer sells a handheld testing device, this device requires a suite of individual adapters to connect probe connectors of different sizes and styles to the testing device. To an end user who has varying sized probes (with accompanying probe connectors) in need of testing, these adapters are numerous and costly. Moreover, despite testing being mandated by the original equipment manufacturers, testing of ultrasound probes is not universal because of cost issues and time-constraints related to the need for multiple adapters.

There is a need for a universal leakage test adapter to eliminate the end user having to locate various sized adapters, to reduce the difficulty in testing, and to make the process more cost effective. Decreasing the time and money needed to be invested for testing may also increase the percentage of end users who perform testing.

BRIEF SUMMARY

A universal current leakage testing adapter is provided according to one embodiment of the disclosure. When a probe connector is coupled to the universal current leakage testing adapter, all of the probe connector's pins are electrically connected together. The universal current leakage testing adapter may include multiple conductive stages for coupling with a variety of differently configured probe connectors. Each conductive stage is progressively larger in width, length, or both than the previous conductive stage. Two or more conductive stages may be present in a universal current leakage testing adapter. At least two of the conductive stages can function in concert to contact the pins of a probe connector of a particular configuration. In some embodiments, the conductive stages that are smaller in length, width, or both, telescope at least partially into the larger conductive stages to form combined contact surfaces of increasing size. Each contact surface is configured to electrically couple with a probe connector of the same general dimensions.

The universal current leakage testing adapter may contain a gripping device. If a probe connector having a center locking pin is coupled to a universal current leakage testing adapter, a gripping device may grip the center locking pin. The center locking pin will pass through a pass-through in the first conductive stage. If a center locking pin is not present on the probe connector, the gripping device may prevent the conductive stages from telescoping.

Some embodiments of universal current leakage testing adapters contain a micro switch. The micro switch prevents the conductive stages from being electrically coupled to the electrical source connector, unless a center locking pin has been inserted into a gripping device. When a center locking pin has been inserted, the micro switch electrically couples the conductive stages to the electrical source connector.

Some embodiments of universal current leakage testing adapters contain at least one spring. The spring keeps a conductive stage elevated from the housing of the universal current leakage testing adapter unless pressure opposing the spring is applied to the conductive stage it is coupled with.

Further areas of applicability of the present disclosure will become apparent from the detailed description provided hereinafter. It should be understood that the detailed description and specific examples, while indicating various embodiments, are intended for purposes of illustration only and do not limit the scope of the disclosure.

Figure 2:
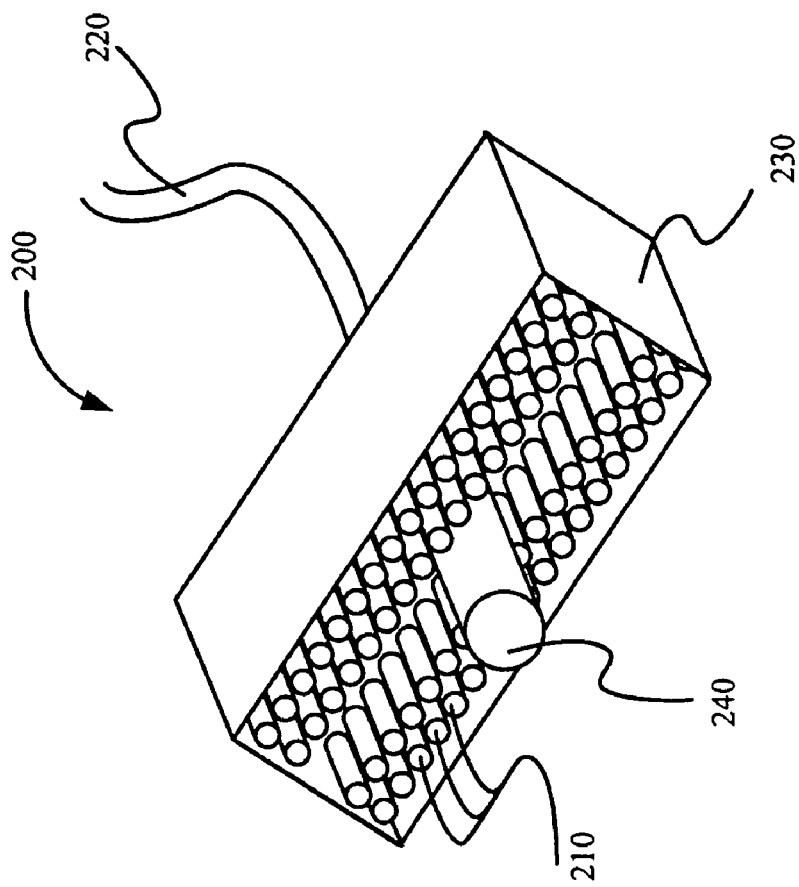
FIG. 2 shows a different embodiment of a probe connector.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The ensuing description provides various embodiments of the invention only and is not intended to limit the scope, applicability or configuration of the disclosure. Rather, the ensuing description of the embodiments will provide those skilled in the art with an enabling description for implementing an embodiment. It should be understood that various changes may be made in the function and arrangement of elements without departing from the spirit and scope as set forth in the appended claims.

Embodiments of the present disclosure are directed towards a universal current leakage testing adapter. A universal current leakage testing adapter, for example, may be coupled with a plurality of ultrasound probe connectors of different sizes and shapes. In some embodiments, all or substantially all of the pins of a probe connector are electrically connected together when coupled with the universal current leakage testing adapter. In some embodiments, the universal current leakage testing adapter allows for a plurality of differently sized and shaped probe connectors to be coupled to one universal current leakage testing adapter. This is accomplished by the universal current leakage testing adapter modifying its effective contact surface with the probe connector.

In some embodiments, the effective contact surface of the universal current leakage testing adapter is modified by conductive stages telescoping through each other. As pressure is applied to each successive conductive stage, the contact surface of the corresponding stages becomes substantially planar and increases the effective contact area with a probe connector.

A universal current leakage testing adapter, according to various embodiments described herein, may be used to test the current leakage of a probe. For example, a user may couple the universal current leakage testing adapter with a voltage source via an electrical source connector. The probe connector may be coupled with the universal current leakage testing adapter and the probe may be submerged in a conductive liquid, such as saltwater. Electrodes attached to a measuring device, such as an ammeter or Voltmeter, may be inserted into the liquid. When power is supplied to the voltage source, the universal current leakage testing adapter is energized supplying power to the pins of the probe connector, which, in turn, supplies the current to the probe. The current leaking from the probe may be measured via the electrodes in the liquid by the ammeter or Voltmeter to determine if there is any current leakage from the probe. In other embodiments, a current source (often with very low current) is used instead of a voltage source.

Figure 1:
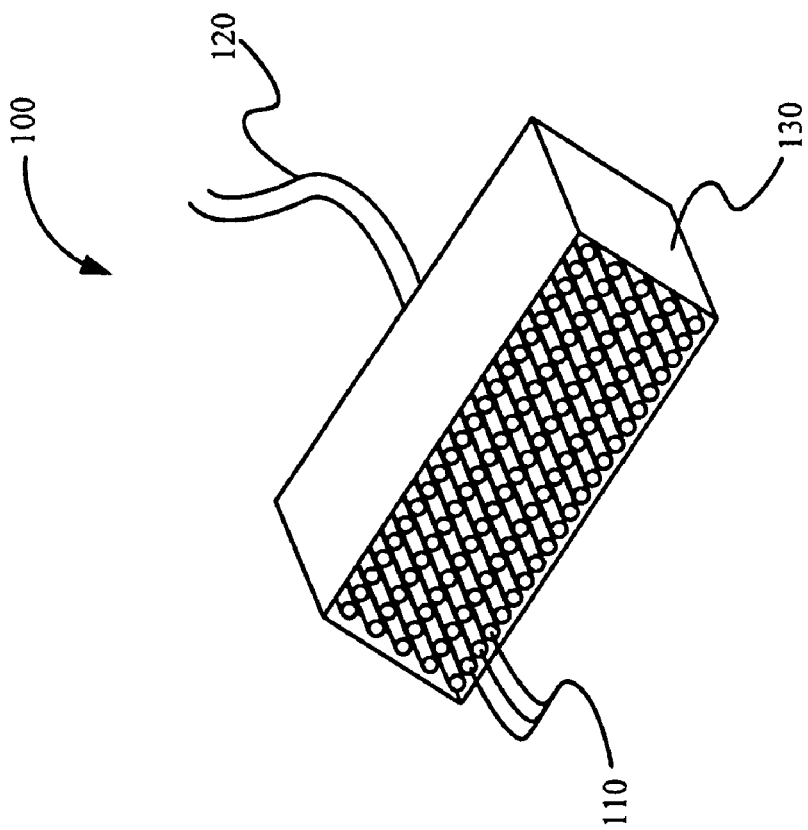
FIG. 1 shows a probe connector according to one embodiment.

Referring to FIG. 1, a probe connector 100 is illustrated. Probe connector 100 has pins 110 coupled with a wire or harness of wires 120 that may be coupled with a probe (not pictured). In some embodiments of probe connector 100, plurality of pins 110 are recessed a distance from the lowest protrusion of probe connector 100's outer housing 130.

FIG. 2 illustrates a probe connector 200 with a different configuration than the probe connector shown in FIG. 1. Probe connector 200 has pins 210 coupled with a wire or harness of wires 220 that may be coupled with a probe (not pictured). Probe connector 200 has a larger width and length than probe connector 100. Probe connector 200 has fewer pins 210 than pins 110 in probe connector 100 shown in FIG. 1. Pins 210 may include pins of different dimensions and spacing. As can be seen in the figures, the width and length of the probe connector shown in FIG. 2 is greater than the width and length of the probe connector shown in FIG. 1. Probe connector 200 contains a center locking pin 240. Pins 210 are recessed a greater distance from the lowest protrusion of probe connector 200's outer housing 230 than pins 110 are recessed from the lowest protrusion of probe connector 100's outer housing 130 shown in FIG. 1.

FIG. 1 and FIG. 2 illustrate two examples of probe connectors. One skilled in the art will understand that probe connectors vary in shape, size, and pin configurations. For example, some probe connectors include a center locking pin. In other examples of probe connectors, the number, size, shape, and arrangement of pins vary. In some examples of probe connectors, the distance pins are recessed from the outermost protrusion of a probe connector's housing may vary, along with the length, width, and height of the probe connector.

The variations between probe connector 100, probe connector 200, and the general differences noted in the preceding paragraph between probe connectors illustrate the need for a universal current leakage testing adapter. Embodiments disclosed herein provide for a universal current leakage testing adapter that may couple with probe connectors of various sizes, shapes, and pin configurations, such as, the probe connectors shown in FIG. 1 and FIG. 2.

Figure 3C:
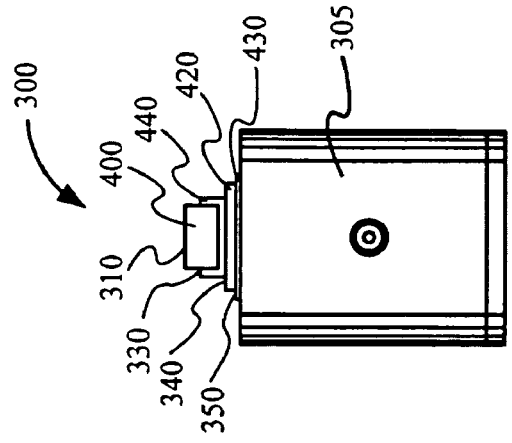
FIGS. 3A-3C show a top view and two side views of a universal current leakage testing adapter according to one embodiment.
Figure 3A:
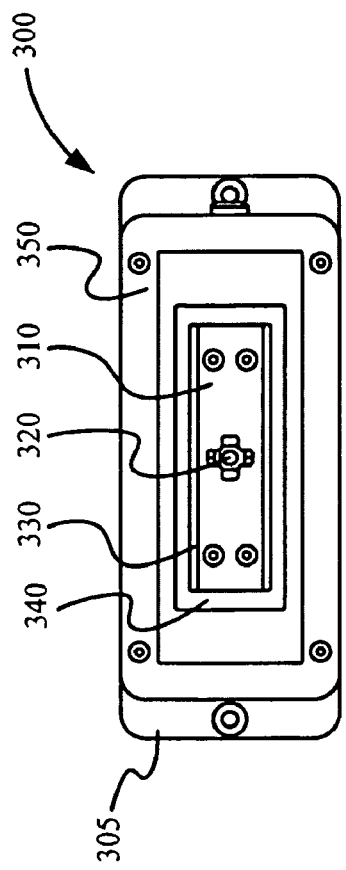

FIG. 3A illustrates a top view of one embodiment of universal current leakage testing adapter 300. In this embodiment, four contact surfaces are present. A first contact surface 310 includes a pass-through 320 for a center locking pin of a probe connector, such as center locking pin 240 in FIG. 2. A second contact surface 330 partially frames first contact surface 310 on two sides. A third contact surface 340 frames first contact surface 310 and second contact surface 330 on four sides. A fourth contact surface 350 frames first contact surface 310, second contact surface 330, and third contact surface 340 on four sides.

In this embodiment, each successive contact surface has a greater edge-to-edge width, length, or both, compared to the contact surface it at least partially frames. For example, a contact surface could have the same edge-to-edge width, but a greater edge-to-edge length than a second contact surface. This second contact surface could be framed on two sides. A contact surface that has the same edge-to-edge length, but a greater edge-to-edge width than a second contact surface, could also frame the second contact stage on two sides. A contact surface that has a greater edge-to-edge width and a greater edge-to-edge length than a second contact surface could frame the second contact surface on four sides. As one skilled in the art will understand, the width and length of each contact surface could be varied to accommodate the dimensions of different sized probe connectors. Further, as one skilled in the art will understand, other embodiments of a universal current leakage testing adapter could include two, three, five, or more contact surfaces, each progressive contact surface increasing in length, width, or both, compared to the contact surface it at least partially frames.

Thus far, only embodiments of square or rectangular contact surfaces have been disclosed; however, other shapes could be used for contact surfaces. For example, circular contact surfaces could be used on some embodiments of a universal current leakage test adapter. Each successive circular contact surface could have an increased radius over the previous contact surface; thus, each successive circular contact surface would encircle or frame the previous contact surface. In some embodiments, the contact surfaces could be polygons. The successive contact surface could frame the previous contact surface on at least one side or portion of a side. Other embodiments could include combinations of geometric shapes, such as a semicircle with a polygonal section opposite the semicircle's curvature. In these embodiments, each successive contact surface could frame the previous contact surface on at least one side or a portion of a side.

Figure 3B:
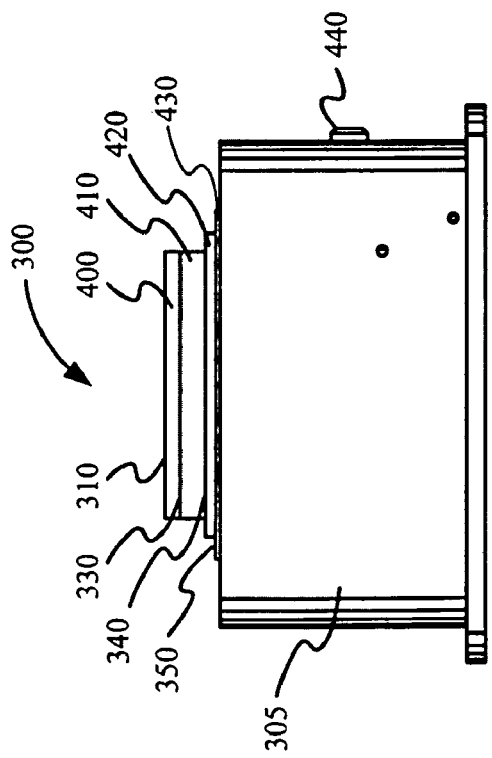

FIG. 3B illustrates a side view of universal current leakage testing adapter 300 according to one embodiment. In this embodiment, four conductive stages protrude from universal current leakage testing adapter housing 305. A first conductive stage 400 is visible as the highest stage protruding from universal current leakage testing adapter housing 305. The top surface of first conductive stage 400 is first contact surface 310. A second conductive stage 410 has the same length as first conductive stage 400 and is visible as the second highest stage protruding from the universal current leakage testing adapter housing 305. The top surface of second conductive stage 410 is second contact surface 330. A third conductive stage 420 has a greater length than first conductive stage 400 and second conductive stage 410, and is visible as the third highest stage protruding from universal current leakage testing adapter housing 305. The top surface of third conductive stage 420 is third contact surface 340. A fourth conductive stage 430 has a greater length than first conductive stage 400, second conductive stage 410, and third conductive stage 420, and is visible as the fourth highest stage protruding from universal current leakage testing adapter housing 305. The top surface of fourth conductive stage 430 is fourth contact surface 350. An electrical source connector 440 may be coupled with housing 305. An electrical source connector 440 is electrically attached to conductive stages 400, 410, 420, and 430, and allows for an electrical connection between the conductive stages 400, 410, 420, and 430, and an external electrical source (not pictured).

Contact surfaces and conductive stages may be made out of any material capable of conducting an electric charge. In one embodiment, both the contact surfaces and the conductive stages are made of copper. In other embodiments, iron, steel, aluminum or a combination thereof may be used. One skilled in the art will recognize that innumerable material can be used for the exposed contact surfaces and the conductive stages, as long as the material is capable of conducting an electrical charge. Further, the conductive stages and the contact surfaces do not need to be made of the same material. Housing 305 could be comprised of any material capable of maintaining a shape, including, but not limited to, metal, wood, or plastic. Further, housing 305 could be a conductor or an insulator.

Electrical source connector 440 could be connected to any number of different electrical sources. In this embodiment, electrical source connector 440 may be connected to a 115 Volt AC electrical source. Embodiments of electrical sources include, but are not limited to, constant voltage sources and variable voltage sources. Other embodiments of electrical sources include, but are not limited to, constant current sources and variable current sources.

In some embodiments, the height difference between each contact surface can vary. This variance in height between contact surfaces may allow for pins to be contacted that are recessed from a probe connector's outer housing. In the embodiment of FIG. 3B, it can be seen that the distance between first conductive surface 310 and second conductive surface 330 is smaller than the distance between second conductive surface 330 and third conductive surface 340. As those skilled in the art will understand, different embodiments of universal current leakage testing adapters may vary distances between contact surfaces to accommodate different distances that pins are recessed from the outer housing of their accompanying probe connectors.

FIG. 3C illustrates an alternate side view of universal current leakage testing adapter 300 according to one embodiment. As in FIG. 3B, first contact surface 310 and accompanying first conductive stage 400 is visible as the highest stage protruding from universal current leakage testing adapter housing 305. Second contact surface 330 and accompanying second conductive stage 410 are visible as the second highest stage protruding from universal current leakage testing adapter housing 305. In this embodiment, second conductive stage 410 has a greater width than first conductive stage 400. Third contact surface 340 and accompanying third conductive stage 420 are visible as the third highest stage protruding from the universal current leakage testing adapter housing 305. Third conductive stage 420 has a greater width than first conductive stage 400 or second conductive stage 410. The fourth contact surface 350 and accompanying fourth conductive stage 430 are visible as the fourth highest stage protruding from universal current leakage testing adapter housing 305. As those skilled in the art will understand, different embodiments of the invention may include different widths or distances between contact surfaces, or a different number of stages.

Figure 4B:
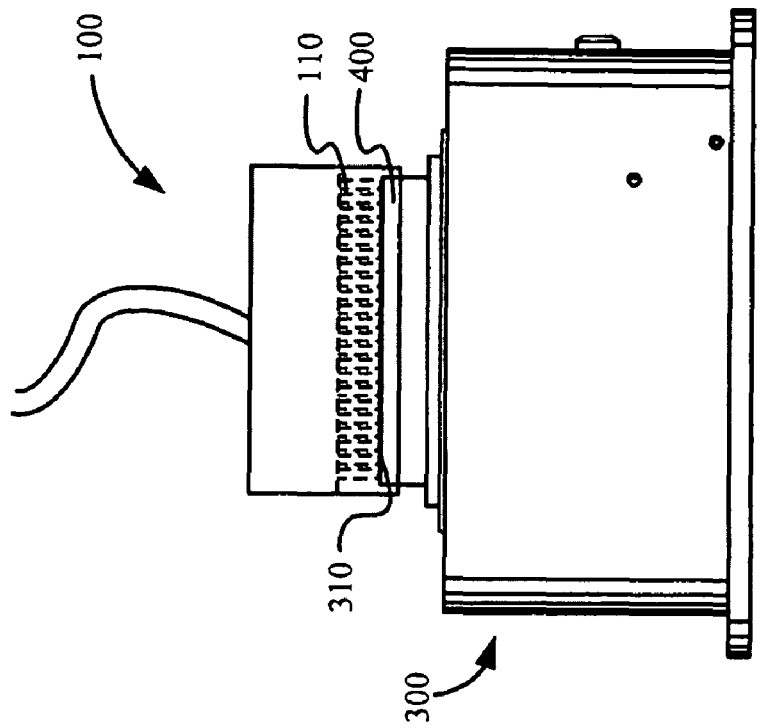
FIG. 4B shows the side view of FIG. 4A after a probe connector has been coupled with a universal current leakage testing adapter according to one embodiment.
Figure 4A:
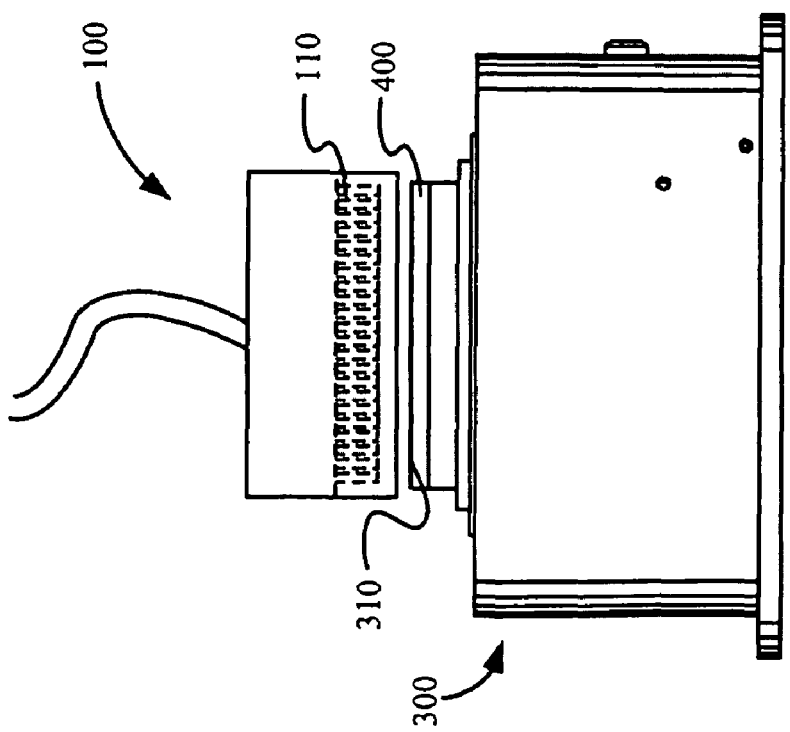
FIG. 4A shows a side view of a probe connector prior to being coupled with a universal current leakage testing adapter according to one embodiment.

FIG. 4A illustrates universal current leakage testing adapter 300 prior to coupling with probe connector 100, according to one embodiment. Probe connector 100 corresponds to the length of first conductive stage 400. FIG. 4B illustrates probe connector 100 after probe connector 100 has been coupled with universal current leakage testing adapter 300. Pins 110 of probe connector 100 contact first contact surface 310 of first conductive stage 400. In some embodiments, the physical act of coupling probe connector 100 to the current universal leakage test adapter is accomplished by a user grasping probe connector 100 and applying force to the universal current leakage testing adapter through probe connector 100.

Figure 4D:
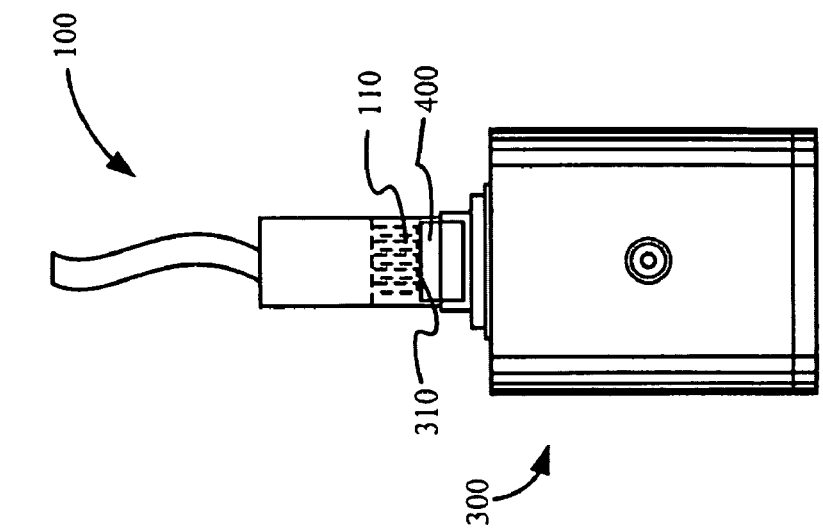
FIG. 4D shows the side view of FIG. 4C after a probe connector has been coupled with a universal current leakage testing adapter according to one embodiment.
Figure 4C:
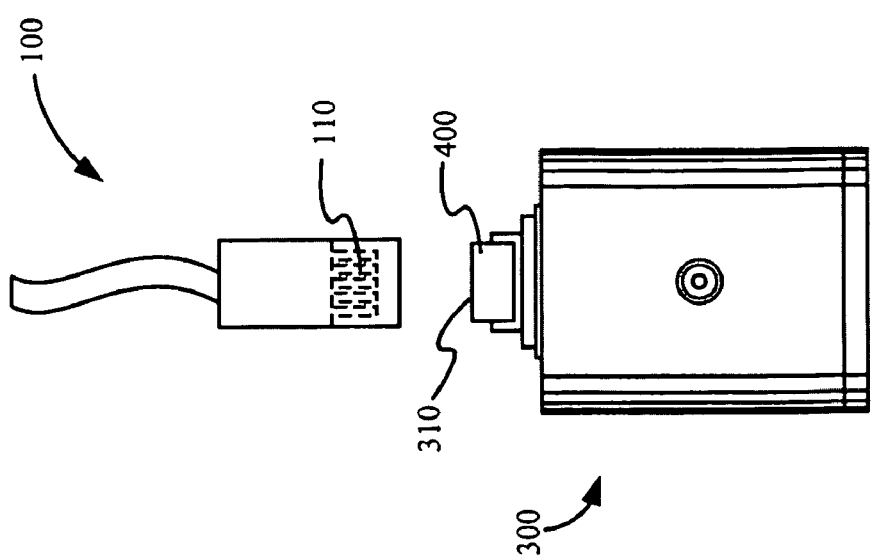
FIG. 4C shows another side view of the embodiment of FIG. 4A prior to a probe connector being coupled with a universal current leakage testing adapter according to one embodiment.

FIG. 4C illustrates universal current leakage testing adapter 300 again prior to coupling with probe connector 100, viewed from an alternate side, according to one embodiment. Probe connector 100 corresponds to the width of first conductive stage 400. FIG. 4D illustrates probe connector 100 after being coupled with universal current leakage testing adapter 300. Pins 110 of probe connector 100 contact first contact surface 310.

Figure 5B:
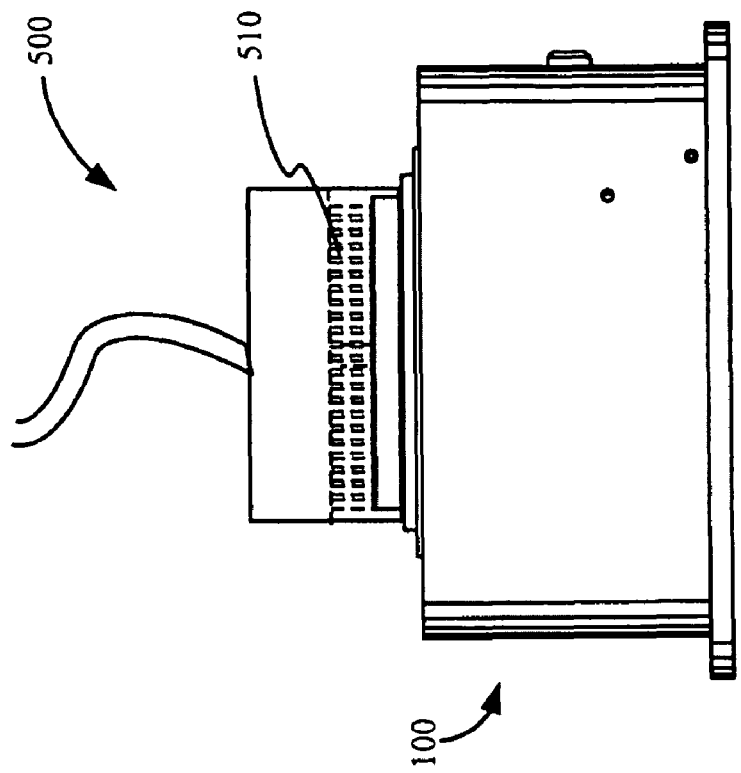
FIG. 5B shows the side view of FIG. 5A after a probe connector has been coupled with the universal current leakage testing adapter according to one embodiment.
Figure 5A:
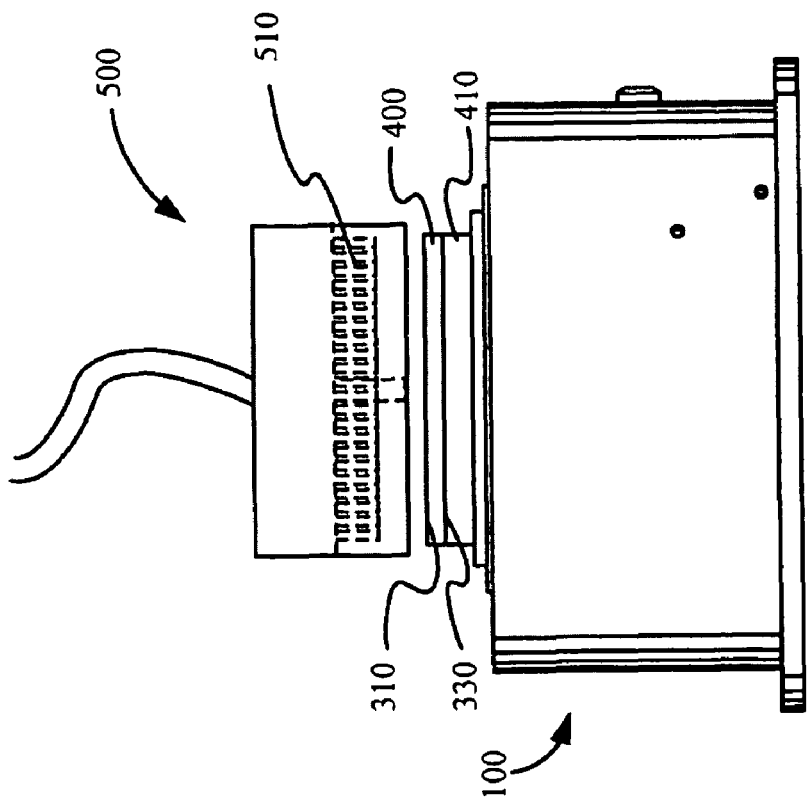
FIG. 5A shows aside view of a probe connector prior to being coupled with a universal current leakage testing adapter according to one embodiment.

FIG. 5A illustrates a probe connector 500 prior to coupling with universal current leakage testing adapter 300. Probe connector 500 has a greater length than probe connector 100 of FIG. 1, and of FIGS. 4A-4D. In this embodiment, probe connector 500 corresponds to the length of second conductive stage 410. Probe connector 500 is pictured prior to coupling with universal current leakage testing adapter 100. FIG. 5B illustrates probe connector 500 after probe connector 500 has been coupled with universal current leakage testing adapter 300. Contact surface 310 of first conductive stage 400 contacts at least some of pins 510 of Probe connector 500. As pressure is applied to first conductive stage 400 through probe connector 500, first conductive stage 400 telescopes at least partially into second conductive stage 410 until contact surface 310 of first conductive stage 400 is substantially planar with contact surface 330 of second conductive stage 410. Contact surface 330 of second conductive stage 410 not contacts at least some of pins 510 of probe connector 500. First contact surface 310 and second contact surface 330 function in concert to contact pins 510 on probe connector 500.

Figure 5D:
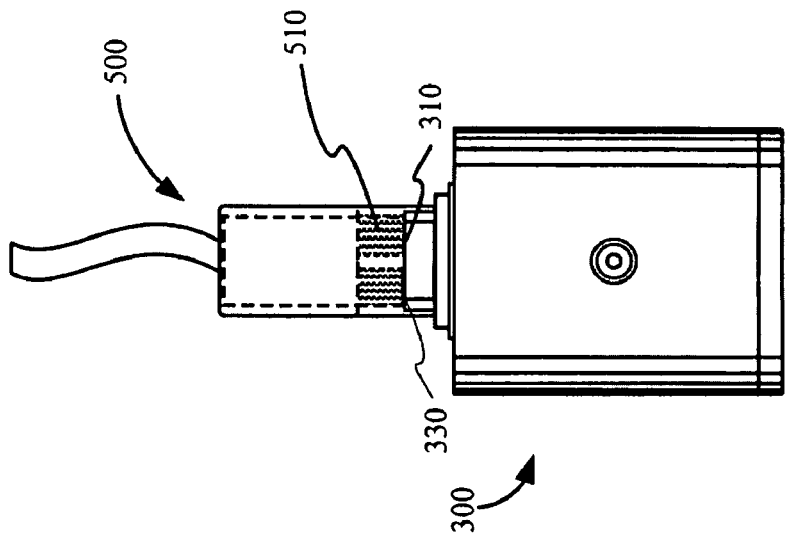
FIG. 5D shows the side view of FIG. 5C after a probe connector has been coupled with a universal current leakage testing adapter according to one embodiment.
Figure 5C:
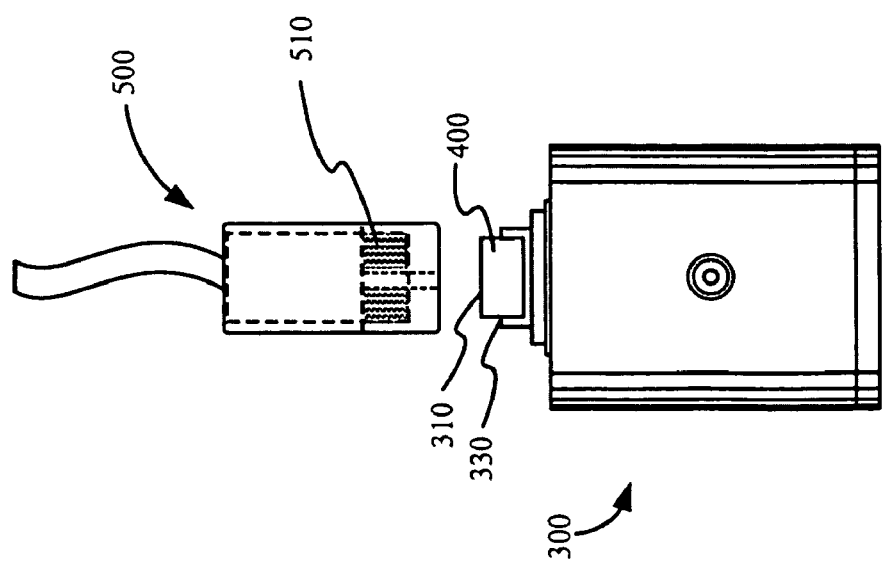
FIG. 5C shows another side view of the embodiment of FIG. 5A prior to a probe connector being coupled with a universal current leakage testing adapter according to one embodiment.

FIG. 5C illustrates the larger probe connector of FIG. 5A and FIG. 5B prior to coupling with universal current leakage testing adapter 300, viewed from another side, according to one embodiment. Probe connector 500 corresponds to the width of second conductive stage 410. FIG. 5D illustrates probe connector 500 after probe connector 500 has been coupled with universal current leakage testing adapter 300. As can been seen from this illustration, force applied to first conductive stage 400 through probe connector 500 has caused first conductive stage 400 to telescope into second conductive stage 410, making contact surface 310 substantially planar with contact surface 330. First contact surface 310 and second contact surface 330 function in concert to contact pins 510 on probe connector 500.

Figure 6:
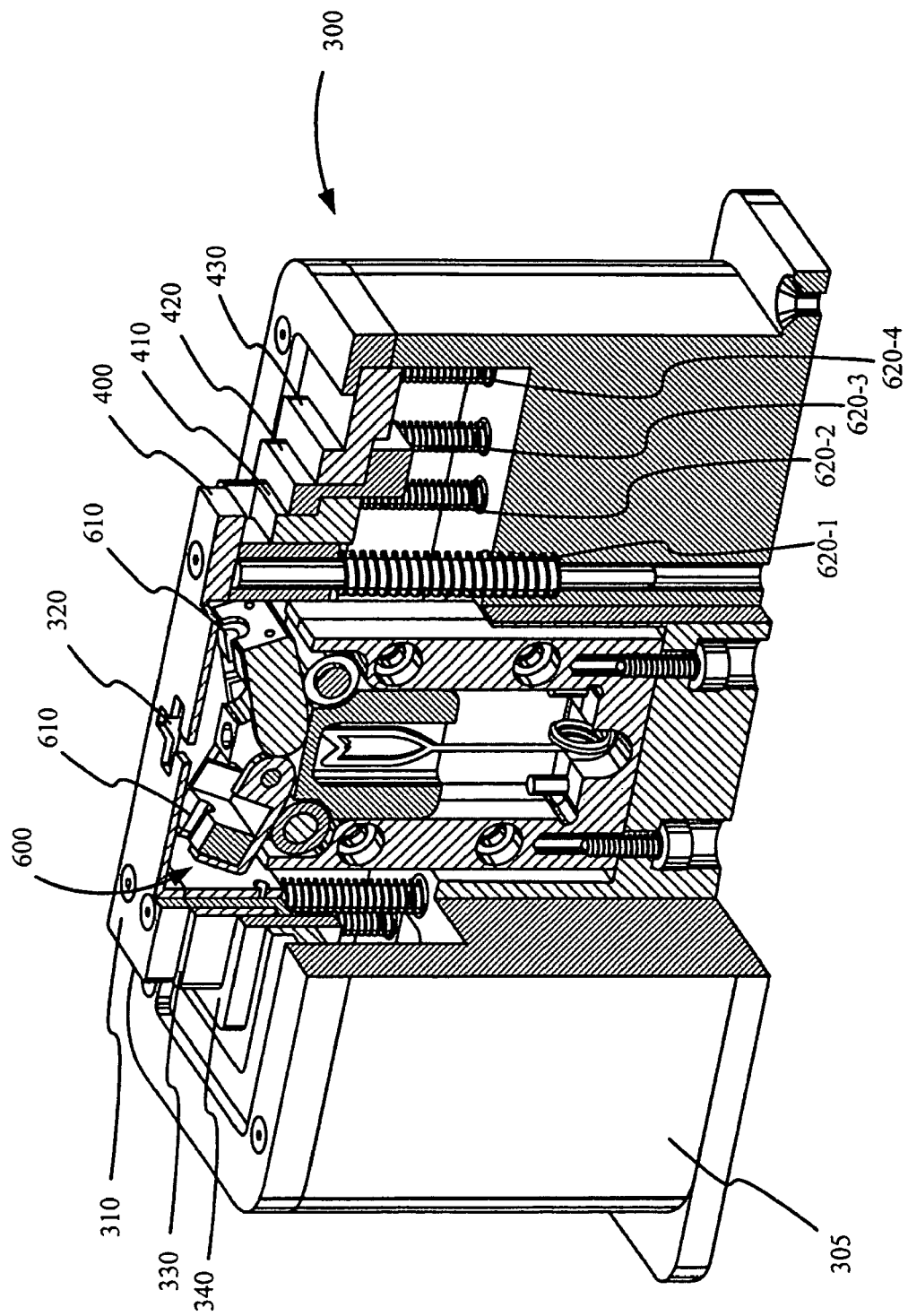
FIG. 6 shows a partial cross-section of a universal current leakage testing adapter according to one embodiment.

FIG. 6 illustrates universal current leakage testing adapter 300 with a section of housing 305 and conductive stages 400, 410, 420, and 430 cut away, according to one embodiment. In this embodiment, beneath pass-through 320 in first conductive stage 400 is a gripping device 600 for gripping a center locking pin of a probe connector. Griping device 600 has a pair of jaws 610 which closes on either side of a center locking pin when a center locking pin contacts gripping device 600.

In this embodiment, jaws 610 are comprised of rubber to allow for grip on a variety of different sized center locking pins. In another embodiment, jaws 610 could be comprised of any deformable material capable of gripping a center locking pin. Alternatively, jaws 610 could be comprised of a non-deformable material.

In some embodiments, a release mechanism is incorporated into the gripping device. After a center locking pin has been inserted into the gripping device and the gripping device has gripped the center locking pin, a probe connector is coupled with the universal current leakage testing adapter. In some embodiments, the probe connector is released from the universal current leakage testing adapter by the user applying pressure to the universal current leakage testing adapter through the probe connector. This application of pressure causes the gripping device to release the center locking pin and allows for the probe connector to be decoupled from the universal current leakage testing adapter.

FIG. 6 illustrates one embodiment of how conductive stages may be coupled with the universal current leakage testing adapter housing 305. Each stage is coupled with at least one spring 620, which is coupled with universal current leakage testing adapter housing 305. Springs 620 may keep each conductive stage elevated unless pressure is applied to a stage to compress at least one spring 620. One skilled in the art will understand that springs 620 could be replaced with any object capable of supplying force to each conductive stage. In some embodiments, no object capable of supplying force is present. In these embodiments, the user may manually manipulate each stage to couple with a probe connector.

With further reference to the embodiment of FIG. 6, when a probe connector corresponding to the length and width of first conductive stage 400 is coupled to universal current leakage testing adapter 300, first contact surface 310 contacts pins of the probe connector. When a probe connector corresponding to the dimensions of second conductive stage 410 is coupled to universal current leakage testing adapter 300, contact between the probe connector and universal current leakage testing adapter 300 is first made on first contact surface 310. As pressure by a user is applied to the probe connector, spring 620-1 coupled with first conductive stage 400 compresses. As spring 620-1 compresses, first conductive stage 400 telescopes through at least part of second conductive stage 410. After telescoping a distance through second conductive stage 410, contact surface 310 is substantially planar with contact surface 330 of second conductive stage 410. The total surface area contacting the plurality of pins of the probe connector is the area of contact surface 310 added to the area of contact surface 330. In this state, contact surface 310 is functioning concert with contact surface 330 to contact pins of the probe connector corresponding to the dimensions of second conductive stage 410.

Further referring to the embodiment of FIG. 6, when a probe connector corresponding to the dimensions of third conductive stage 420 is coupled to universal current leakage testing adapter 300, contact between the probe connector and universal current leakage testing adapter 300 is first made with first contact surface 310. As pressure is applied by a user to the probe connector, spring 620-1 coupled with first conductive stage 400 compresses. As spring 620-1 compresses, first conductive stage 400 telescopes through at least a part of second conductive stage 410. After telescoping a distance through at least part of second conductive stage 410, contact surface 310 will be substantially planar with contact surface 330. As further pressure is applied to the probe connector by a user, first conductive stage 400 and second conductive stage 410 will telescope in concert through at least part of third conductive stage 420. After telescoping a distance, contact surface 310, second contact surface 330, and third contact surface 340 of third conductive stage 420 will be substantially planar. In this state, first contact surface 310, second contact surface 330, and third contact surface 340 are functioning in concert to contact a plurality of pins of the probe connector that corresponds to the dimensions of third conductive stage 420.

Figure 7:
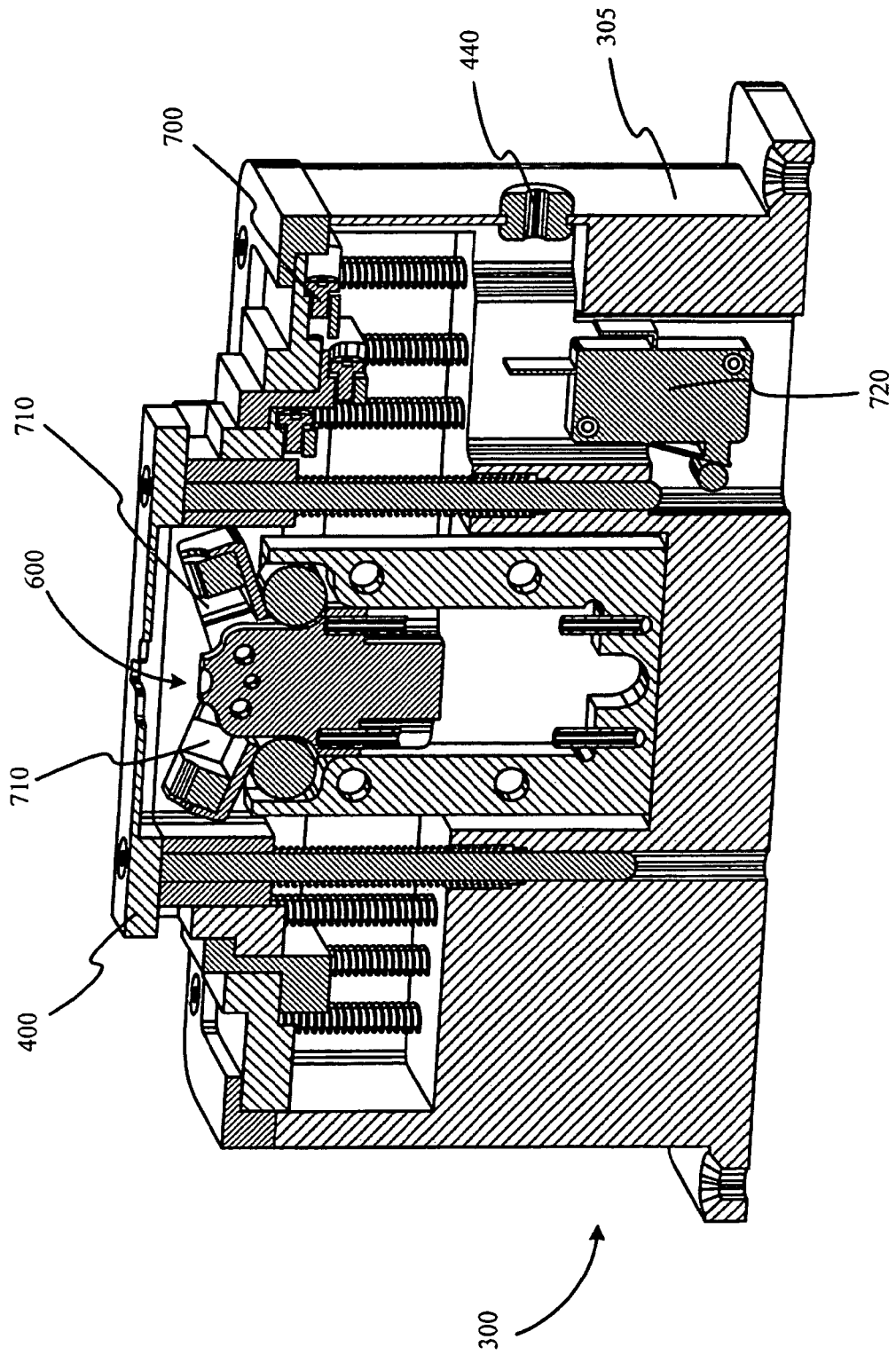
FIG. 7 shows a cross-section of a universal current leakage testing adapter according to one embodiment.

FIG. 7 illustrates a cross section of universal current leakage testing adapter 300, according to one embodiment. In this embodiment, each conductive stage is electrically coupled together in series via a wire 700. While a wire is used in this embodiment, any form of electrical connection between the conductive planes could be used; for example, the planes could be in physical contact with each other, or a liquid could serve to electrically connect the planes. This embodiment utilizes a micro switch 720 to prevent conductive stages from being actively connected to electrical source connector 440 unless a center locking pin has been inserted into gripping mechanism 600. If a center locking pin is not present on a probe connector, first conductive stage 400 will contact gripping arms 710 when pressure is applied to the probe connector and will not telescope farther into universal current leakage testing adapter housing 305. When a center locking pin is not present, micro switch 720 will not trigger. When micro switch 720 has not triggered, the universal current leakage testing adapter 300 is not electrically connected to electrical source connector 440. This prevents a voltage or current from being applied to the conductive stages unless a probe connector with a center locking pin has been coupled with the universal current leakage testing adapter 300. When a center locking pin is inserted into gripping device 600, gripping arms 710 will rotate, first conductive stage 400 will not contact the gripping arms 710, and micro switch 720 will trigger, electrically connecting electrical source connector 440 to the conductive stages.

Specific details are given in the above description to provide a thorough understanding of the embodiments. However, it is understood that the embodiments may be practiced without these specific details. For example, circuits, structures, and/or components may be shown in block diagrams in order not to obscure the embodiments in unnecessary detail. In other instances, well-known circuits, processes, structures, and components may be shown without unnecessary detail in order to avoid obscuring the embodiments.

While the principles of the disclosure have been described above in connection with specific apparatuses and methods, this description is made only by way of example and not as limitation on the scope of the disclosure.

What is claimed is:

1. A device for applying current to at least a first probe connector and a second probe connector, wherein the first probe connector and the second probe connector are different sizes, the device comprising:

a housing;

a first conductive stage coupled with the housing, the first conductive stage being configured to contact a plurality of pins of the first probe connector when the first probe connector is coupled with the device; and a second conductive stage coupled with the housing, the second conductive stage being configured to contact a plurality of pins of the second probe connector when the second probe connector is coupled to the device, wherein a contact surface of the first conductive stage functions in concert with a contact surface of the second conductive stage to contact a plurality of pins of the second probe connector when the second probe connector is coupled to the device.

2. The device of claim 1, wherein the second conductive stage at least partially frames the first conductive stage, allowing the first conductive stage to telescope through the second conductive stage, resulting in the contact surface of the first conductive stage being substantially planar with the contact surface of the second conductive stage when the second probe connector is coupled to the device.

3. The device of claim 1, wherein the first conductive stage comprises a pass-through for a center locking pin of the first or second probe connector.

4. The device of claim 1, further comprising a gripping mechanism coupled with the housing, the gripping mechanism being configured to grip a center locking pin of the first or second probe connector.

5. The device of claim 1, further comprising a third conductive stage coupled with the housing, the third conductive stage contacting a plurality of pins of a third probe connector, when the third probe connector is coupled to the device, wherein the contact surface of the first conductive stage and the contact surface of the second conductive stage function in concert with a contact surface of the third conductive stage to contact a plurality of pins of the third probe connector when the third probe connector is coupled to the device.

6. The device of claim 5, wherein the third conductive stage at least partially frames the first and second conductive stages, allowing the first and second conductive stages to telescope through the third conductive stage, resulting in the contact surfaces of the first and second conductive stages being substantially planar with the contact surface of the third conductive stage, when the third probe connector is coupled to the device.

7. The device of claim 1, further comprising at least a first electrical source connector electrically coupled with at least the contact surface of the first conductive stage.

8. The device of claim 1, further comprising a micro switch to electrically couple and electrically decouple at least the first conductive stage to and from an electrical source connector.

9. A device for applying current to probe connectors of different sizes, the device comprising:
a housing;
a first conductive stage coupled with the housing having a first exposed surface corresponding to a first size probe connector; and
a second conductive stage coupled with the housing having a second exposed surface corresponding to a second size probe connector;
wherein in a first configuration, the first exposed surface contacts a plurality of pins of the first size probe connector, and
wherein in a second configuration, the first exposed surface and the second exposed surface contact a plurality of pins of the second size probe connector.

10. The device of claim 9, wherein the second configuration further comprises the first conductive stage depressing through the second conductive stage and the first exposed surface being substantially planar with the second exposed surface.

11. The device of claim 9, further comprising:
a third conductive stage coupled with the housing, having a third exposed surface corresponding to a third size probe connector;
wherein in a third configuration, the first exposed surface, the second exposed surface, and the third exposed surface contact a plurality of pins of the third size probe connector.

12. The device of claim 9, wherein the first exposed surface comprises a pass-through for a center locking pin of one of the probe connectors.

13. The device of claim 9, further comprising a gripping device to couple with a center locking pin of one of the probe connectors.

14. The device of claim 9, further comprising a switch to electrically couple and electrically decouple each of the first and second conductive surfaces to and from an electrical source connector when one of the first and second conductive surfaces is depressed.

15. A device for applying current to probe connectors of varying sizes, comprising:
first means for contacting a first plurality of pins of a first probe connector with a first connector size; and
second means for contacting a second plurality of pins of a second probe connector with a second connector size, wherein a contact surface of the first means functions in concert with a contact surface of the second means to contact a plurality of pins of the second means when the second probe connector is coupled to the device.

16. The device of claim 15, further comprising a means for applying voltage to one of the probe connectors through at least the first means.

17. The device of claim 15, further comprising a gripping means for gripping a center locking pin of one of the probe connectors.

18. The device of claim 15, further comprising a means for electrically connecting a plurality of pins on one of the probe connectors to electrical ground.

19. The device of claim 15, further comprising a third means for contacting a plurality of pins on a third probe connector with a third connector size, wherein the contact surface of the first means and the contact surface of the second means function in concert with a contact surface of the third means to contact a plurality of pins of the third means when the third means is coupled to the device.

20. The device of claim 15, further comprising a means for electrically connecting each means that is in contact with pins on one of the probe connectors to a means for supplying current.

* * * * *